United States Patent [19]

Jarrett et al.

[11] 4,286,176
[45] Aug. 25, 1981

[54] COMPARATOR WITH HYSTERESIS FOR INTERFACING WITH A GROUND-REFERENCED A.C. SENSOR

[75] Inventors: Robert B. Jarrett; Wilson D. Pace, both of Tempe, Ariz.

[73] Assignee: Motorola, Inc., Phoenix, Ariz.

[21] Appl. No.: 30,672

[22] Filed: Apr. 16, 1979

[51] Int. Cl.³ .......................... H03K 5/08; H03K 5/00
[52] U.S. Cl. .................................... 307/261; 307/290; 307/352; 307/557
[58] Field of Search ............... 307/260, 261, 268, 290, 307/352, 296, 237

[56] References Cited

U.S. PATENT DOCUMENTS

| | | | |
|---|---|---|---|
| 3,666,970 | 5/1972 | Abbott et al. | 307/290 |
| 3,754,182 | 8/1973 | Morris | 307/290 |
| 3,988,595 | 10/1976 | Eatock | 307/290 |

*Primary Examiner*—Stanley D. Miller, Jr.
*Assistant Examiner*—B. P. Davis
*Attorney, Agent, or Firm*—Charles R. Lewis

[57] ABSTRACT

An interface circuit is disclosed for receiving a ground-referenced A.C. signal for detecting transitions of the A.C. signal about ground potential. An input transistor is enabled when the A.C. signal voltage falls below ground potential by one base-emitter forward drop. The input transistor is disabled when the A.C. signal voltage rises above ground potential by one base-emitter forward drop. A feedback circuit and a bias circuit are coupled to the input transistor for switching the threshold levels of the input transistor. The interface circuit employs a hysteresis-type switching action for improving noise immunity while providing a symmetric output waveform. The circuit requires only a single power supply and is suitable for fabrication as a highly dense, monolithic integrated circuit. Also, the circuit provides a low input impedance to large positive and negative voltage transients.

8 Claims, 5 Drawing Figures

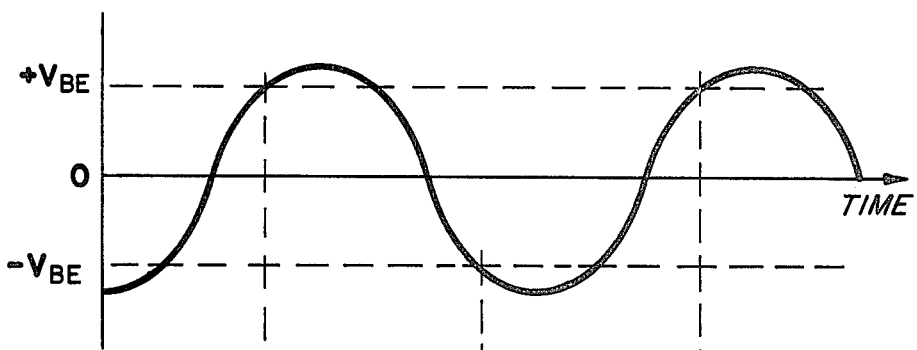
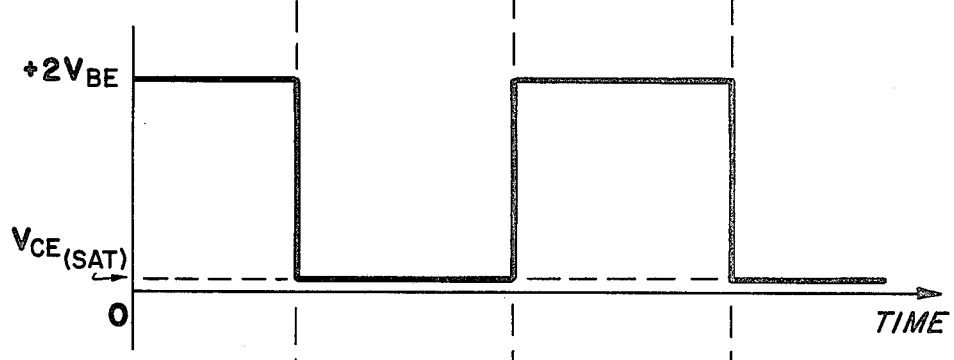
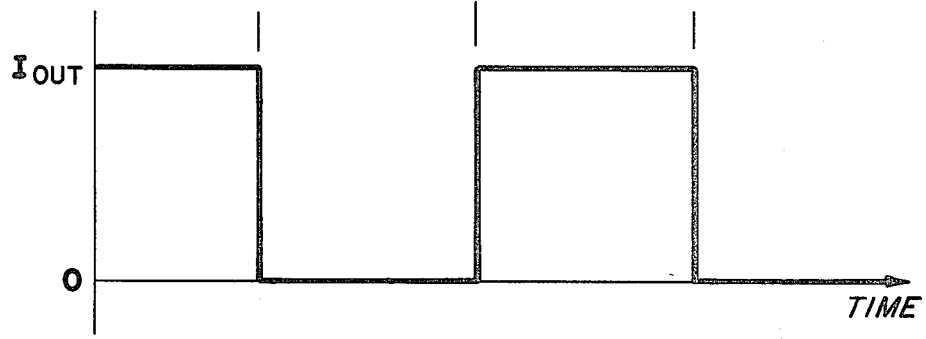

ered A.C. sensor.

COMPARATOR WITH HYSTERESIS FOR INTERFACING WITH A GROUND-REFERENCED A.C. SENSOR

TECHNICAL FIELD

This invention relates generally to switching circuitry and more particularly to an interface circuit which symmetrically detects transitions of an A.C. signal about a reference potential and which provides hysteresis-type switching action.

BACKGROUND ART

Integrated circuit technology is finding many applications in the field of engine control, particularly with regard to controlling automobile engines. One of the engine parameters which often must be sensed by an engine control system is the rotational speed of the engine crankshaft. One known method for detecting the crankshaft speed is to cause the crankshaft to vary a magnetic field surrounding a sensor coil so as to generate an A.C. signal in the coil. An appropriate interface circuit may be used to detect the oscillations of the A.C. signal about a reference potential. The rotational speed of the crankshaft can then be determined since the frequency of the generated A.C. signal is proportional to the crankshaft speed.

In such engine control systems, large voltage transients having magnitudes from 100 to 200 volts are not uncommon. These large voltage transients can be harmful to the interface circuit coupled to the crankshaft speed sensor unless proper safeguards are employed.

Furthermore, noise signals often present in the environment of an engine control system can falsely trigger the interface circuit used to detect transitions of the A.C. signal. The introduction of hysteresis in switching circuits is known in the art for reducing the effect of noise signals and improving the noise margin of switching circuits. For example, a regenerative comparator or Schmitt trigger is shown by Strauss, *Wave Generation and Shaping,* 1970 McGraw-Hill Book Company, pp. 445–447.

Another consideration in constructing circuitry for detecting transitions of the A.C. signal about a reference potential is that the output waveform generated by the inerface circuit should be a symmetrical square wave, i.e., an output pulse with a fifty percent (50%) duty cycle. The reason for this requirement is that tachometer circuits, used to convert the frequency of the output waveform generated by the interface circuit into a D.C. voltage proportional to the crankshaft speed, often require an input pulse having a fifty percent (50%) duty cycle for maximum efficiency.

Further considerations in selecting an interface circuit for detecting transitions of the A.C. signal about a reference potential are suitability for operation with a single supply voltage as opposed to the need for both positive and negative supply voltages, and suitability for fabrication as an integrated circuit without requiring large amounts of chip area.

The difficulty in providing an interface circuit which is responsive to a ground referenced A.C. signal and which provides the advantages of hysteresis-type switching action while maintaining a symmetrical output waveform is that symmetric threshold levels (or trip points) must be provided above and below ground potential. Many prior art threshold circuits employ differential comparators wherein the input waveform is compared to one or more threshold levels. However, in applications where the threshold levels can be both above and below ground potential, these prior art differential comparator circuits require either both positive and negative power supplies or, if the circuit is to operate with a single supply voltage, extra circuit components for performing a voltage level-shifting function. Therefore, those skilled in the art should appreciate that an interface circuit responsive to a ground-referenced signal which provides a symmetric output waveform, which provides hysteresis-type switching action, and which may be fabricated as a highly dense integrated structure that requires a single power supply is a significant improvement over the prior art.

BRIEF SUMMARY OF THE INVENTION

It is an object of the present invention to provide circuitry for interfacing to a ground-referenced A.C. sensor and which provides a symmetric square wave output.

It is a further object of the present invention to provide an interface circuit responsive to a ground-referenced A.C. sensor which provides a hysteresis-type switching action for increasing noise immunity.

Another object of the present invention is to provide an interface circuit responsive to a ground-referenced A.C. sensor which can operate from a single power supply.

A further object of the present invention is to provide an interface circuit responsive to a ground-referenced A.C. sensor which can be fabricated as a highly dense integrated circuit.

Finally, an object of the present invention is to provide an interface circuit responsive to a ground-referenced A.C. sensor such that the performance of the interface circuit is not impaired by large voltage transients which may be coupled into the A.C. sensor.

These and other objects are accomplished by providing an interface circuit which includes an input circuit responsive to an A.C. signal voltage which oscillates about a reference potential such that an output signal is enabled when the A.C. signal voltage differs from a control voltage by a predetermined amount. The switching circuit also includes feedback circuitry responsive to the output signal enabled by the input circuit for switching an output terminal between a first and second state, such that the first state renders the control voltage substantially equal to the reference potential about which the A.C. signal oscillates. The switching circuit also includes bias circuitry for establishing the control voltage at a bias voltage whenever the output terminal of the feedback circuitry is in the second state, such that the bias voltage differs from the reference potential by substantially twice the predetermined amount.

BRIEF DESCRIPTION OF THE DRAWINGS

FIG. 3A, FIG. 3B, and FIG. 3C are timing diagrams which show the A.C. signal, the voltage on a control node, and an output current, respectively.

DETAILED DESCRIPTION OF THE INVENTION

Figure 1:
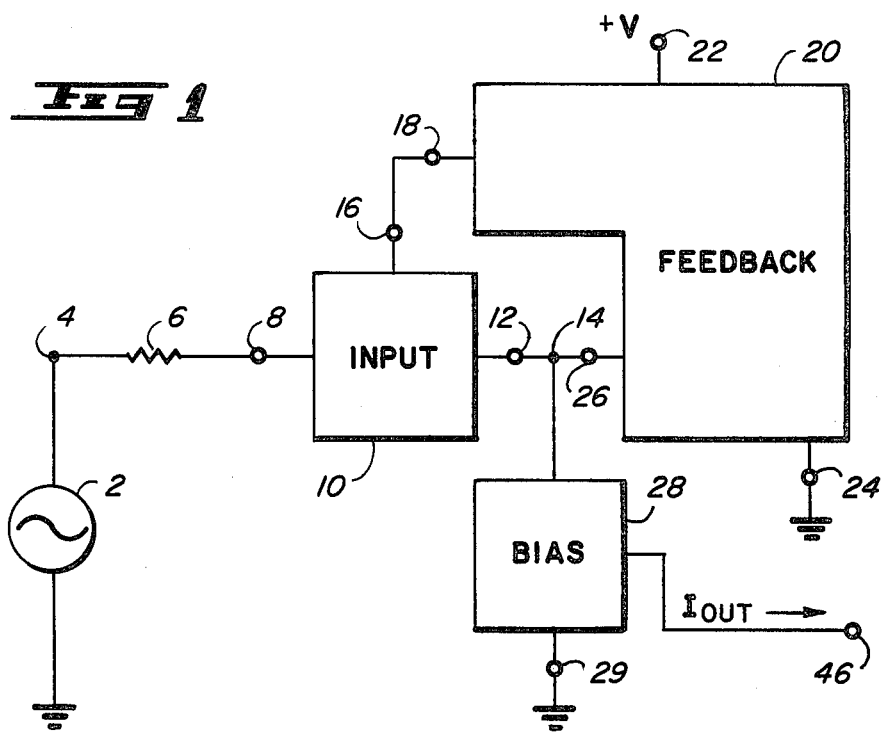
FIG. 1 is a block diagram of an interface circuit according to the present invention which is coupled to a ground-referenced A.C. sensor.

FIG. 1 illustrates a block diagram of an interface circuit according to the present invention. A ground-referenced A.C. sensor 2 is shown coupled between node 4 and a source of ground potential. Resistor 6 is coupled between node 4 and an input terminal 8 of input block 10. Input block 10 also includes a control terminal 12 which is coupled to control node 14 for receiving a control voltage. Input block 10 also includes an output terminal 16 for providing an output signal. Output terminal 16 is coupled to input terminal 18 of feedback block 20. Feedback block 20 includes terminal 24 which is coupled to a source of ground potential and terminal 22 which is coupled to a positive voltage supply. Feedback block 20 also includes an output terminal 26 which is coupled to control node 14. Bias block 28 is also coupled to control node 14. In addition, bias block 28 includes terminal 29, which is coupled to a source of ground potential, and output terminal 46 which provides an output current.

The operation of the circuit shown in FIG. 1 will now be briefly described. Assume initially that the voltage at node 4 is approximately −1 volt and the voltage at control node 14 is a bias voltage of approximately two base-emitter forward voltage drops above ground potential. Under these circumstances, the voltage at input terminal 8 falls toward −1 volt. However, when the voltage at input terminal 8 falls to a voltage corresponding to one base-emitter forward voltage drop below the control voltage at node 14, the voltage at input terminal 8 is clamped and the first output signal is enabled onto output terminal 16. Feedback block 20 senses that the first output signal is enabled and maintains output terminal 26 in a second state such that bias block 28 establishes the control voltage at node 14 at the initially assumed bias voltage. Also, when output terminal 26 is in the second state, the output current provided by output terminal 46 has a magnitude $I_{OUT}$.

In order to switch the interface circuit in the positive direction, the voltage of the A.C. signal at node 4 must increase in excess of one bae-emitter forward voltage drop above ground potential. At that time, input terminal 8 will be less than one base-emitter forward voltage drop below the control voltage at node 14 and the first output signal will no longer be enabled. Feedback block 20 senses that the first output signal is no longer enabled and causes output terminal 26 to switch from the second state to a first state such that the control voltage at node 14 is essentially equal to ground potential. Since input terminal 8 is more positive than the control voltage, the first output signal remains disabled. Thus, the control voltage at node 14 remains at substantially ground potential. Also, when output terminal 26 is in the first state, the output current provided by output terminal 46 is switched to a magnitude of zero.

In order to switch the interface circuit in the negative direction, the voltage at node 4 must fall to approximately one base-emitter forward voltage drop below ground potential. At this time, input terminal 8 will again be one base-emitter forward voltage drop below the control voltage at node 14 (ground potential), and the first output signal at terminal 16 will again be enabled. Upon the first output signal being enabled, feedback block 20 switches output terminal 26 from the first state back to the second state and bias block 28 again establishes the control voltage at node 14 at two base-emitter forward voltage drops above ground potential. The voltage at input terminal 8 also rises until it again reaches the clamped voltage level of one base-emitter drop below the control voltage. As output terminal 26 switches back to the second state, the magnitude of the output current provided by output terminal 46 increases from zero to $I_{OUT}$.

Figure 2:
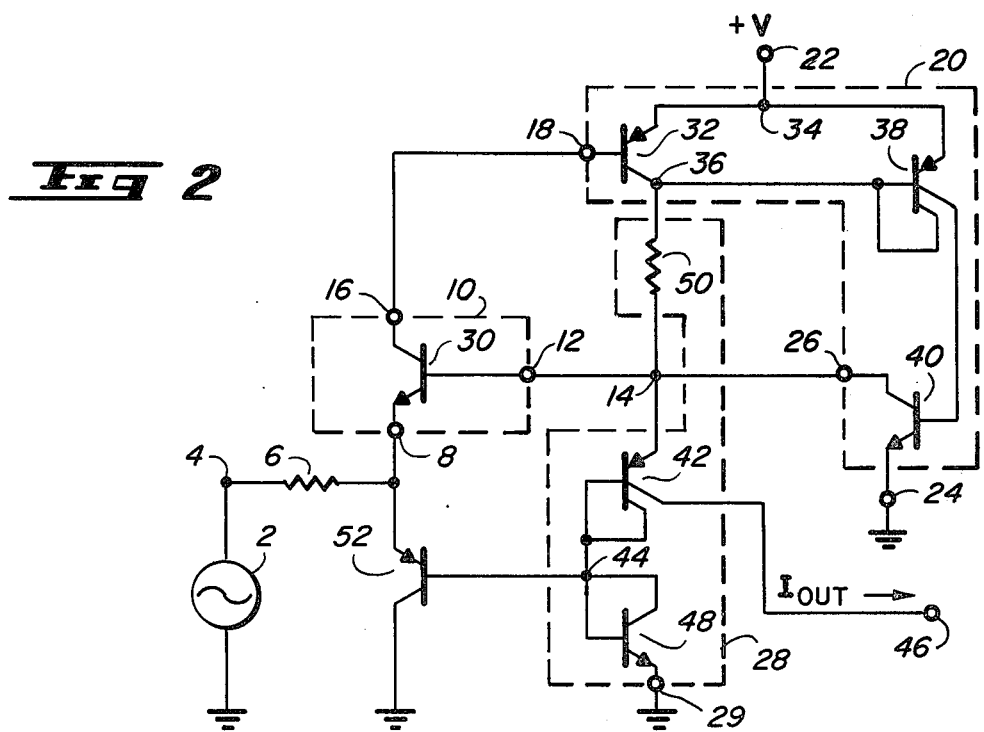
FIG. 2 is a circuit schematic of a preferred embodiment of the interface circuit shown in block form in FIG. 1.

Shown in FIG. 2 is a circuit schematic of a preferred embodiment of the present invention. Those portions of FIG. 2 which correspond with the block diagram in FIG. 1 are referenced accordingly. Input block 10 (shown in dashed lines) includes a first transistor 30. Transistor 30 has its emitter coupled to input terminal 8, its base coupled to control terminal 12, and its collector coupled to output terminal 16. Control terminal 12 is coupled to control node 14 for receiving the control voltage. Transistor 30 enables output terminal 16 to conduct collector current when input terminal 8 is one base-emitter forward voltage drop below the control voltage at node 14.

Feedback block 20 (shown in dashed lines) includes transistors 32, 38 and 40. Transistor 32 has its base coupled to input terminal 18 which, in turn, is coupled to output terminal 16 of input block 10. The emitter of transistor 32 is coupled to node 34 which, in turn, is coupled to a supply terminal 22 for receiving a positive supply voltage. The collector of transistor 32 is coupled to node 36 for providing an output signal to transistor 38. Transistor 38 is a double-collector transistor which has its base and a first collector coupled in common to node 36. The emitter of transistor 38 is coupled to node 34 for coupling to the positive supply voltage, and the second collector of transistor 38 is coupled to the base of transistor 40. Transistor 40 has its emitter coupled to terminal 24 for coupling to a source of ground potential. The collector of transistor 40 is coupled to output terminal 26 which, in turn, is coupled to control node 14.

Bias block 28 (shown in dashed lines in FIG. 2) includes transistor 42, transistor 48 and resistor 50. Transistor 42 is shown as a double-collector transistor having its base and a first collector coupled in common to node 44. The emitter of transistor 42 is coupled to control node 14, and the second collector is coupled to output terminal 46. Transistor 48 has its base and collector coupled in common to node 44, while its emitter is coupled to a source of ground potential. Thus, transistor 42 and transistor 48 are coupled in series between control node 14 and ground potential, the transistors being connected to each other at series-coupled node 44. Bias block 28 further includes resistor 50 which is coupled between node 36 and control node 14. Also shown in FIG. 2 is clamping transistor 52 which has its emitter coupled to input terminal 8, its collector coupled to a source of ground potential, and its base connected to series-coupled node 44.

The operation of the circuitry shown in FIG. 2 will now be explained with the aid of the timing waveforms shown in FIG. 3A, FIG. 3B and FIG. 3C. Assuming initially that the voltage of the A.C. signal at node 4 is roughly −1 volt, as is shown initially in FIG. 3A, then transistor 30 enables output terminal 16 to conduct current from the base of transistor 32. The value of resistor 50 is selected such that transistor 32 becomes saturated when transistor 30 is conducting. Therefore, the voltage at node 36 approaches the positive supply voltage at node 34 such that the base-emitter junction of transistor 38 is not sufficiently forward biased to allow transistor 38 to conduct current. Since transistor 38 is not conducting, transistor 40 is not supplied with base current and can therefore not conduct any collector current from output terminal 26. The condition where transistor 40 conducts current from output terminal 26 may be referred to as a first state, while the condition where transistor 40 does not conduct current from output terminal 2 may be referred to as a second state.

In the second state, with transistor 40 not conducting current, collector current provided by transistor 32 is coupled to control node 14 by resistor 50. The current supplied by resistor 50 to node 14 is further conducted by transistors 42 and 48 to ground potential. Thus, the voltage at node 44 is one base-emitter voltage drop above ground potential, and the voltage at control node 14 is two base-emitter voltage drops above ground potential, as is shown initially in FIG. 3B. In the preferred embodiment, the areas of the first and second collectors of transistor 42 are identical such that the first and second collectors of transistor 42 each conduct approximately one-half of the emitter current of transistor 42. Thus, the output current $I_{OUT}$ supplied by output terminal 46 is approximately equal to $$\tfrac{1}{2}\cdot(V_{CC}-3V_{BE})/R_{50}$$

where $V_{CC}$ is the positive supply voltage at terminal 22, $V_{BE}$ is one base-emitter forward voltage drop, and $R_{50}$ is the value of resistor 50.

Since the voltage at control node 14 is established at two base-emitter voltage drops above ground potential, the voltage at input terminal 8 is clamped by transistor 30 at one base-emitter voltage drop above ground potential. The low impedance exhibited by the emitter electrode of transistor 30 is effective to clamp the voltage at input terminal 8 irregardless of large negative voltage transients which may appear at node 4.

Now it will be assumed that time passes and the A.C. signal voltage at node 4 crosses ground potential and rises approximately toward +1 volt, as is shown in FIG. 3A. When the A.C. signal voltage at node 4 is slightly in excess of one base-emitter forward voltage drop above ground potential, then the forward bias across the base-emitter junction of transistor 30 is no longer sufficient to maintain conduction. With transistor 30 being rendered nonconductive, base current is no longer drawn from the base of transistor 32, and transistor 32 is rendered nonconductive. The voltage at node 36 begins to fall to the voltage at control node 14 until the base-emitter junction of transistor 38 becomes forward biased by one base-emitter forward voltage drop. At this time, transistor 38 becomes conductive and base current is supplied to the base of transistor 40. Transistor 40 saturates such that the voltage at output terminal 26 (and therefore at control node 14) falls to within a saturation voltage $V_{CE}$ of ground potential. In this so-called first state, the control voltage at control node 14 is substantially equal to ground potential. In the preferred embodiment, the first and second collectors of transistor 38 have equal areas such that the base drive supplied to transistor 40 is equal to the current conducted by resistor 50. This current will be approximately equal to the power supply voltage $V_{CC}$ minus the base-emitter drop of transistor 38 divided by the resistance value of resistor 50.

Since transistor 40 causes the control voltage at node 14 to be substantially equal to ground potential, transistor 42 is rendered nonconductive. Clamping transistor 52 and transistor 48 are effective to prevent the voltage at input terminal 8 from being in excess of two base-emitter forward voltage drops above ground potential. The low impedance path provided by the emitter of transistor 52 is effective to clamp input terminal 8 irregardless of any large positive voltage transients which may occur at node 4.

When transistor 40 and output terminal 26 are switched to the first state, the voltage at control node 14 differs from ground potential only by the collector-emitter saturation voltage $V_{CE}$ of transistor 40, as is shown in FIG. 3B. When the control voltage at node 14 is substantially ground potential, transistor 42 is no longer conductive, and the current supplied by output terminal 46 drops to zero, as is shown in FIG. 3C.

Upon the A.C. signal voltage at node 4 returning below ground potential, transistor 30 remains nonconductive until the voltage at node 4 is one base-emitter forward voltage drop below the ground potential established at control node 14 by transistor 40. At that time, transistor 30 again becomes conductive, feedback block 20 turns transistor 40 off, and the control voltage at node 14 is re-established at two base-emitter forward voltage drops above ground potential by bias block 28.

As can be noticed from the timing wave forms in FIGS. 3A–3C, the circuitry in FIG. 2 provides a symmetrical output waveform having a fifty percent (50%) duty cycle while providing hysteresis-type switching action. Also, the circuitry shown in FIG. 2 operates with a single supply voltage and does not require additional components for voltage level-shifting. Large negative voltage transients are clamped by transistor 30 while large positive voltage transients are clamped by transistor 52. Finally, those skilled in the art will realize that the circuitry shown in FIG. 2 may be implemented as a highly dense integrated circuit wherein only four isolated epitaxial regions (not shown) are required to fabricate the circuit components. A first isolated epitaxial region contains transistor 30 and transistor 32. A second isolated region contains transistor 38 and resistor 50. A third isolated region contains transistor 40; while a fourth isolated epitaxial region contains transistors 42, 48 and 52.

While the invention has been described with reference to a preferred embodiment, the description is for illustrative purposes only and is not to be construed as limiting the scope of the invention. Various modifications and changes may occur to those skilled in the art without departing from the true spirit and scope of the invention as defined in the appended claims.

We claim:

1. A circuit suitable for detecting transitions of an A.C. signal having a voltage which oscillates about a reference potential, the circuit providing hysteresis-type switching action and providing a symmetrical output waveform, the circuit comprising:
    (a) input means including an input terminal for receiving the A.C. signal, a control terminal coupled to a control node for receiving a control voltage, and an output terminal for providing a first output signal, said input means being responsive to the A.C. signal voltage and to the control voltage such that the first output signal is enabled upon the A.C. signal voltage being different from the control voltage by a first predetermined amount;
    (b) feedback means having an input terminal coupled to the output terminal of said input means and having an output terminal coupled to the control node, said feedback means being responsive to the first output signal for switching the output terminal of said feedback means between a first state and a second state, the first state being effective to render the conrol voltage at the control node substantially equal to the reference potential;

(c) bias means coupled to the control node for establishing the control voltage at the control node at a bias voltage whenever the output terminal of said feedback means is in the second state, the bias voltage being different from the reference potential by substantially twice the first predetermined amount;

(d) clamping means coupled between the input terminal of said input means and a source of the reference potential for restricting the voltage of the A.C. signal from being different from the reference potential in excess of a second predetermined amount; and (e) circuit output means electrically coupled to said control node and having a symmetrical output signal thereon having a first level when said output terminal of said feedback means is in said first state and having a second level when said output terminal of said feedback means is in said second state.

2. A circuit as recited in claim 1 wherein said bias means is coupled to a source of the reference potential.

3. A circuit as recited in claim 2 wherein said feedback means switches the output terminal of said feedback means from the first state to the second state upon the first output signal being enabled such that a hysteresis-type switching action is provided.

4. A circuit as recited in claim 3 wherein said input means comprises a first transistor having emitter, base, and collector electrodes, the emitter being coupled to the input terminal of said input means, the base being coupled to the control terminal, and the collector being coupled to the output terminal of said input means such that the first predetermined amount is one base-emitter forward voltage drop.

5. A circuit as recited in claim 4 wherein said bias means comprises:

(a) means for providing a bias current to the control node; and (b) first and second means coupled in series between the control node and a source of the reference potential, said first and second means being operative to conduct the bias current and to establish the voltage at the control node at substantially two base-emitter forward voltage drops different from the reference potential whenever the output terminal of said feedback means is in the second state.

6. A circuit as recited in claim 5 wherein said feedback means comprises a second transistor having emitter, base, and collector electrodes, the emitter electrode being coupled to a source of the reference potential, the collector electrode being coupled to the control node, and the base electrode being responsive to the first output signal received by the input terminal of said feedback means for switching the second transistor between conductive and nonconductive states corresponding, respectively, to the first and second states of the output terminal of the feedback means.

7. A circuit as recited in claim 6 wherein said feedback means further comprises:

(a) a third transistor having at least a collector electrode, said third transistor being coupled to the input terminal of said feedback means and responsive to the first output signal for providing a second output signal at the collector electrode; and (b) a fourth transistor coupled to the collector electrode of said third transistor, said fourth transistor having at least one collector electrode coupled to the base electrode of said second transistor, said fourth transistor being responsive to the second output signal for switching said second transistor between its conductive and nonconductive states.

8. A circuit as recited in claim 1 wherein said clamping means comprises a transistor having emitter, base, and collector electrodes, the emitter being coupled to the input terminal of said input means, the base being coupled to the first and second means at a series-coupled node, and the collector being coupled to a source of the reference potential such that said second predetermined amount is two base-emitter forward voltage drops.

* * * * *